United States Patent
Voser et al.

(10) Patent No.: US 6,802,942 B2
(45) Date of Patent: Oct. 12, 2004

(54) STORAGE PLATE SUPPORT FOR RECEIVING DISK-SHAPED STORAGE PLATES

(75) Inventors: Stephan Voser, Buchs (CH); Martin Dubs, Trubbach (CH)

(73) Assignee: Unaxis Balzers Limited, Balzers (LI)

( * ) Notice: Subject to any disclaimer, the term of this patent is extended or adjusted under 35 U.S.C. 154(b) by 91 days.

(21) Appl. No.: 10/263,157

(22) Filed: Oct. 2, 2002

(65) Prior Publication Data

US 2003/0075434 A1 Apr. 24, 2003

(30) Foreign Application Priority Data

Oct. 23, 2001 (CH) .............................................. 1945/01

(51) Int. Cl.$^7$ .......................... C23C 14/34; C23C 16/00; C23F 1/00
(52) U.S. Cl. ............................. 204/192.12; 204/192.2; 204/298.07; 204/298.09; 204/298.11; 204/298.15; 118/720; 118/721; 118/724; 118/725; 156/345.51; 156/345.52; 156/345.53; 156/345.3; 427/569; 427/128; 427/131; 427/132; 216/67; 216/71
(58) Field of Search ....................... 204/192.12, 298.07, 204/298.09, 298.11, 298.15, 192.2; 118/724, 725, 720, 721; 156/345.51, 345.52, 345.53, 345.3; 427/569, 128, 131, 132; 216/67, 71

(56) References Cited

U.S. PATENT DOCUMENTS

| 4,615,755 A | | 10/1986 | Tracy et al. ................. 156/345 |
| 4,931,135 A | * | 6/1990 | Horiuchi et al. ............... 216/67 |
| 5,822,842 A | * | 10/1998 | Zejda .......................... 29/450 |

OTHER PUBLICATIONS

Machine translation of JP 11–350133.*
Patent Abstracts of Japan, vol. 2000, No. 03, Mar. 30, 2000.
JP 11 350133, dated Dec. 1999.
Swiss Search Report for CF 2001 1945/01, dated Oct. 23, 2001.

* cited by examiner

Primary Examiner—Rodney G. McDonald
(74) Attorney, Agent, or Firm—Notaro & Michalos, PC

(57) ABSTRACT

To generate an especially good heat transfer between a seating face of a storage plate support and a storage plate, during coating with a sputter source in a vacuum installation, the seating face of the storage plate support is slightly annularly convexly arched and the storage plate is clamped in the center as well as on its outer margin by a center mask and an outer mask against the arched seating face. Hereby an especially good heat transfer is attained with very low arching d, whereby the storage plate is treated gently and simultaneously, during the coating process, no layer thickness distribution problems occur through arching that is too large.

14 Claims, 2 Drawing Sheets

STORAGE PLATE SUPPORT FOR RECEIVING DISK-SHAPED STORAGE PLATES

FIELD AND BACKGROUND OF THE INVENTION

The invention relates to a storage plate support as well as to the use of a storage plate support for processing optical storage plates.

Surface treatment of storage plates for information technology today takes place during the production of such plates primarily with processes in vacuum systems. Herein storage plates are treated for magnetic storage techniques as well as optical storage systems. For surface treatment plasma vacuum processes are often employed, for example for etching the surface, activating the surface, cleaning the surface and in particular depositing layers onto the plate. For the coating process often the widely used sputtering process is employed. Particularly advantageously the plates are coated individually in sequence and cyclically in compact installations. The station times are herein in the range of seconds in order to attain high throughputs for economical reasons.

In the case of magnetic storage plates, the plates onto which layers are applied are as a rule comprised of metal or glass, and, in the case of optical storage plates, optical plastics or polymers are preferably used. Especially during the sputtering process, in which a sputter target is sputtered with the aid of a plasma process at a distance of a few centimeters from the plate, the coating of the plate or of the disk in general entails a rather high introduction of heat, in particular since high deposition rates are necessary with the short required station times. The thermal loading is primarily due to electron bombardment, heat radiation, and kinetic as well as condensation and excitation energy of the coating material. In particular with polymer plates or substrates, and especially in the case of thin plates with low heat capacity, this leads to a temperature increase of the plate if this thermal energy is not sufficiently dissipated. In such cases it is possible for the synthetic plate, which typically is comprised of polycarbonate, to be plastically deformed such that it becomes unusable. Maintaining a safe maximum temperature and attaining a uniform temperature distribution over the plate are essential criteria for achieving good storage plate quality.

It is generally known that the heat transfer in a vacuum is very poor. This is especially the case at low temperature differences, for example of <100° C., such as should be reached in these applications. One option for cooling the plate comprises allowing the coating process in different process stations to proceed sequentially and to interspace one or several cooling stations in between, which cools the plate between the coatings before reaching maximum temperature. The heat transfer between a cooled face and the back of the plate can herein be improved by means of a heat transfer medium, such as for example helium. Short distances or even the supporting of the faces are herein advantageous and the pressure of the gas is increased up to the mbar range in the cooling station. In addition, attempts have been made to press the plate with the aid of electrostatic attraction against a cooled face and to improve the heat transfer by means of a gas cushion. In the case of flat rigid plate-form substrates or workpieces, attempts were furthermore made to hold these at the margin and to tighten it on a spherical arched surface, wherein also a contact pressure is generated which also makes possible gas cooling on the back side, as has been disclosed for example in U.S. Pat. No. 4,615,755. Apart from an improvement of the heat transfer with the aid of gases, contact materials have also been employed, such as tin foils, elastomers, or even paste-form materials.

Use of separate cooling stations between the process stations require considerable technical effort. Moreover, the cooling time is limited to a fraction of the total process time of the substrate, which, in turn, requires good heat transfer through high thermal conductivity and/or a cooling surface cooled below ambient temperature.

Electrostatic attraction of the substrate is difficult to realize especially in the case of nonconducting substrates and produces contact pressure which are significantly lower than the contact pressure which can be attained with conducting substrates. This could take place through a conducting coating of the substrates on the back side or generation of a minimally necessary conductivity in the substrate through suitable doping. But, in particular in the case of optical discs, this is not desired, since, apart from the higher substrate costs, the optical properties of the substrate can also be unfavorably impaired. Clamping the substrate at the outer margin and stretching it onto a spherical or cylindrical face requires stressing range causes stresses in the substrate material such that it can become plastically deformed. In addition, due to the large stressing range, the surface form of the substrate is changed such that thereby the uniformity of the coating is impaired.

SUMMARY OF THE INVENTION

The present invention addresses the problem of eliminating the disadvantages of prior art. In particular, the task of the present invention is to bring a substrate at a predetermined contact pressure into contact with a cooling face, such that the contact pressure is maximally uniformly distributed over the surface and uniform thermal contact occurs. The substrate is herein subjected to minimum flexing stress without the substrate undergoing plastic deformation and while making possible uniform coating.

This task is solved according to the invention through the characteristics of claim 1. Further advantageous embodiments are contained in the dependent patent claims. According to the invention a storage plate support is developed in the region of the seating face for the storage plate such that it is annularly convexly arched such that the storage plate can be clamped in the center as well as also at its outer margin over this annularly convexly developed seating face. Thereby the storage plate assumes the slightly arched, convex form of the seating face after it is fastened. Thereby that this type of storage plate has an opening in the center, these plates can be tightened in this manner in the center as well as also along the outer margin over a mounting which is simultaneously developed as a mask to prevent coating on these sites. This annular, toroidal arching of the plate leads to a significantly more rigid disposition at higher and more uniformly distributed contact pressures over the face as has been possible within prior art and this takes place simultaneously with substantially lower required deflection. The plate is hereby less deformed and simultaneously this low deformation no longer has a negative effect onto the layer thickness distribution of the coating.

The convex flexure line does not necessarily need to be spherical. Due to the temperature gradient between front and back side of the substrate during the coating, this can for example also be taken into consideration in the form of the contact face through additional curvature forms. In particular due to the simple and defined maintainable geometry, the convexity is thus uniquely determined by the constraint conditions on the substrate, such as outer and inner seating, respective clamping condition, pressure forces onto the back side and thermal flexing forces due to temperature gradients in the substrate. A person skilled in the art can now apply known methods for calculating the necessary deformation, such as analytical or finite element calculation methods.

Apart from the form of the seating face, thermal contact can additionally be further improved through a gas cushion, preferably with a gas of high thermal conduction, such as for example helium. The maximum gas pressure should be below the contact pressure. Moreover, ductile metal foils, for example foils comprising tin, or elastomeric films can additionally be advantageously combined with the invention. The storage plate support can be employed for heating as well as also for cooling if it is correspondingly equipped with means for this purpose. But the configuration is advantageously employed for cooling optical storage plates. For this purpose the storage plate support is developed for example as a copper structure, which includes cooling channels through which flows a cooling medium such as cooling water.

The configuration is especially suited for use of optical storage plates comprised of polymer material, in particular of polycarbonate. Such storage plates are known under the term compact discs (CD) and digital versatile disc (DVD). It is understood that this also subsumes all modified types such as CD-R, CD-RW, DVD-R, DVD–RW, DVD+RW, DVD-RAM, which means all writable and rewritable implementations. In particular DVDs are especially problematic in handling, since DVDs are produced from substrates approximately half as thick as CDs, namely in the range of thickness of 0.6 mm. At these thicknesses, thermal effects are especially critical.

The invention will be described in conjunction with a typical embodiment example for cooling rewritable DVDs. For the manufacture of such DVDs typically two substrates comprised of polycarbonate are produced, which are 0.6 mm thick and have a diameter of 120 mm, and subsequently bonded together. The circular substrates have an inner hole in the center with an inner hole diameter of 15 mm. Coating takes place in a vacuum sputter installation, with the layer system comprising for example the following layers: first on the substrate side a layer of $ZnS:SiO_2$, then the optical recording layer, a so-called phase change material, such as for example TeGeSb, then a $ZnS:SiO_2$ layer and lastly an at least partially reflecting aluminum layer with a layer thickness in the range of 100 to 300 nm. The coating of such layer systems typically takes place in a multichamber installation with, for example, six process chambers, with a total coating time of 30 to 60 s. The heat introduction during the coating is approximately 10 $J/cm^2$ or around 1 kJ for the entire disc. The maximum temperature of the disc should be kept as low as possible in order to avoid plastic deformations of the disc; the disc temperature should ideally be lower than 50° C. During the coating the outer mask as well as the inner mask, as a rule, according to prior art are held magnetically on a flat substrate support. During coating, the front side of the disc is heated by the heat flow by around 10° C. relative to the back side, which causes the disk to arch up by about 0.3 mm. Thereby the thermal contact to the substrate support is virtually interrupted. The disc is only cooled right at the outside and right at the inside and becomes impermissibly deformed through the nonuniform temperature loading in the plastic range even if the flat storage plate support is comprised of a good heat-conducting material, such as copper, and is well cooled.

In comparison, the implementation according to the invention has the convexly formed and toroidally arched seating face of the storage plate support. The storage plate support is preferably also a copper structure and is cooled in the same manner as the previously described support. In this example the arching of the support is 1 mm. The same DVD plate was worked under the same conditions for the remainder. The arching of 1 mm leads to a contact pressure of approximately 15 mbar in the case of a cold storage plate. The tensile and compressive stresses occurring herein in the disc are maximally 7 MPa, according to the definition after van Mises (Dubbel, Taschenbuch für Maschinenbau, 14th Edition, p. 228) of comparison stresses calculated with the finite elements method. During the coating the front side of the disc is heated by the heat flow relative to the back side by about 10° C., which slightly reduces the contact pressure and thus also the plate stresses. For comparison, the deflection will be given in the case of a disc clamped only at the outer margin. To attain a contact pressure of 15 mbar, herein a deflection of 3 mm must be generated, with 1 mm occurring through the thermal loading alone. The stronger arching also leads to a greater layer thickness deviation in the coating than in the type of clamping on the inside and the outside according to the invention.

Without cooling the disc temperature increases by around 100° C., and after cooling it becomes unacceptably warped. With a flat storage plate support the disc temperature during the unloading from the installation is approximately 85° C. A certain cooling probably takes place, and a heat transfer coefficient between disc and support of around 50 $W/K/m^2$ can be estimated. With the storage plate support according to the invention the disc temperature after coating is approximately 45° C. Consequently the temperature increase is here only approximately 25° C. relative to ambient temperature. With the storage plate support according to the invention, consequently, a heat transfer coefficient of approximately 150 $W/K/m^2$ is attained. Surprisingly, it could also be found that through the outgassing of substrates of synthetic materials a type of gas cushion is generated between the back side of the plate and the storage plate support seating face, which makes possible an additional improvement of the heat transfer.

Due to the annularly convexly shaped implementation of the seating face of the storage plate support and due to the mounting of the plate at the outer margin and inner margin, a uniform contact pressure is generated between plate and storage plate support, which is maintained even under thermal loading through coating with sputter sources. Hereby a sufficient cooling of the storage plate via the storage plate support is made possible. The uniform contact pressure also produces uniform cooling of the storage plate and therewith avoids excessive thermal, radial and tangential stresses, which would cause the storage plate to become plastically deformed after cooling. The arching of the storage plate support according to the invention is so minimal that it only deviates slightly from a flat seating face. Hereby not only the unacceptable distortion of the storage plate is avoided, the unfavorable effect onto the layer thickness distribution during the sputtering process is also largely avoided.

The various features of novelty which characterize the invention are pointed out with particularity in the claims annexed to and forming a part of this disclosure and are entirely based on the Swiss priority application 2001 1945/01 filed Oct. 23, 2001. For a better understanding of the invention, its operating advantages and specific objects attained by its uses, reference is made to the accompanying drawings and descriptive matter in which a preferred embodiment of the invention is illustrated.

BRIEF DESCRIPTION OF THE DRAWINGS

The invention will subsequently be explained by example in conjunction with schematic Figures.

DESCRIPTION OF THE PREFERRED EMBODIMENTS

Figure 1:
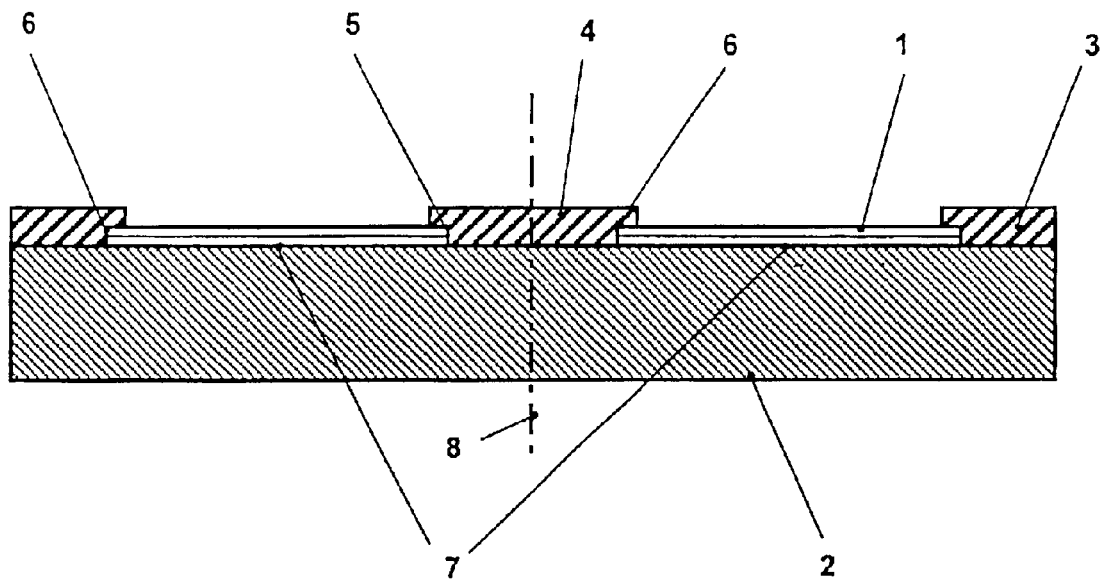
FIG. 1 is a sectional view of a storage plate support with storage plate held by a central mask and an outer mask according to prior art in cross section.
Figure 2:
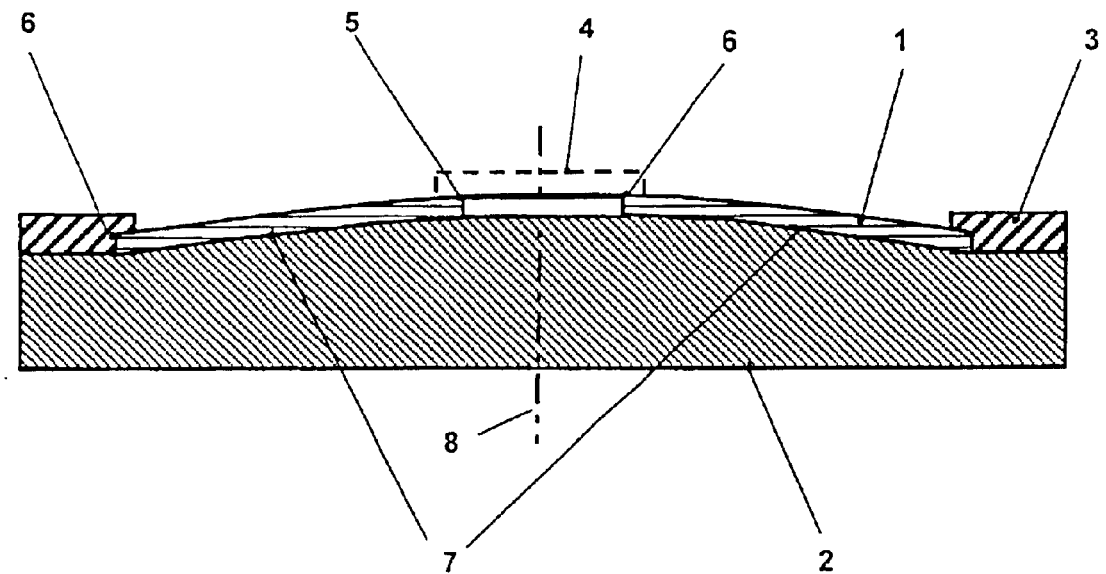
FIG. 2 is a sectional view of a convexly arched storage plate support according to prior art in cross section.

Referring now to the drawings, FIG. 1 depicts, in cross section, a storage plate support 2 for receiving a storage plate 1 with a planar seating face 7 as is customary within prior art. Storage plates are planar disk-form bodies for receiving electronic data. The data can be impressed into the storage plate 1 or the plate substrate or they can be stored in functional layers which are applied onto the substrate 1. Storage plates 1 can also, as is customary in the case of DVDs, have a multistructure form. For reading data in and out, such plates are rotated about their center axis 8. Such storage plates 1 therefore always have an opening 5 in the center, at which the plate can be held. During coating, the inner margin region 6 at the central plate opening 5 as well as also the plate margin 6 must be delimited precisely against a coating. For that reason a central mask 4 is disposed in the center and an outer mask 3 on the plate margin 6, with both masks serving simultaneously as plate mountings, as is also evident in FIG. 1.

To improve the heat transfer, it has already been proposed within prior art, to arch convexly the support plate 2, wherein the outer mask 3, which simultaneously acts as a mounting, tightens the storage plate 1 against the arched seating face 7 of the storage plate support 2. Hereby the storage plate 1 becomes arched and adapts to the convex form of the seating face 7. To attain suitable contact pressures, the storage plate 1 in this embodiment must be arched by several millimeters, which leads to large distortions and exhibits negative effects in layer thickness distribution.

Figure 3:
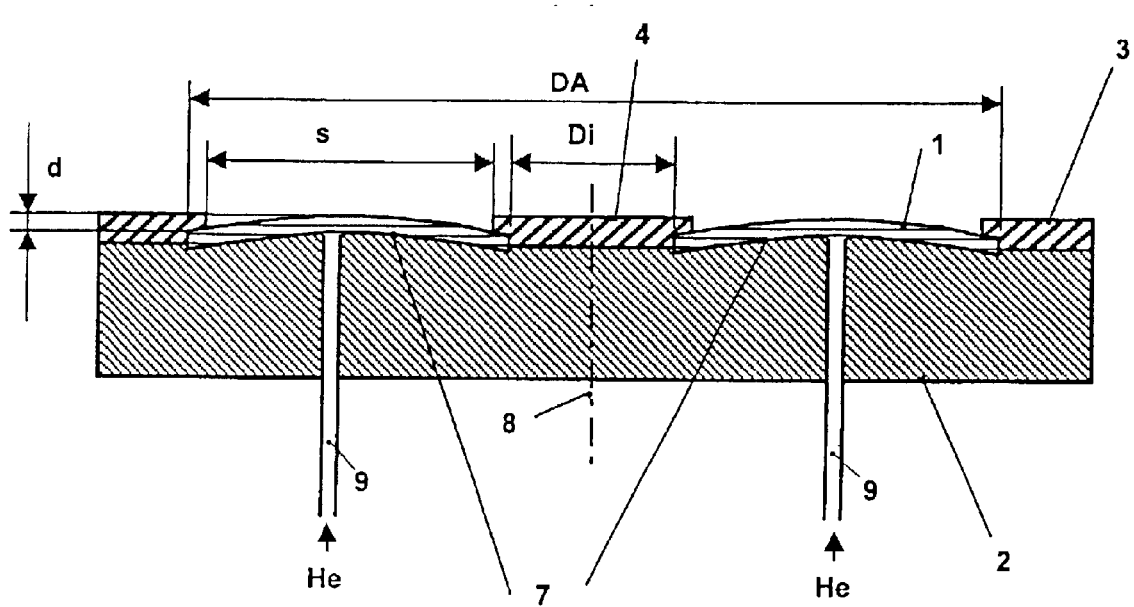
FIG. 3 is a sectional view of a storage plate support according to the invention with a seating face formed annularly and convexly with the storage plate held by a central mask and an outer mask.

According to the invention to improve the heat transfer the seating face 7 of the storage plate support 2 is developed such that it is annularly convexly arched about the center axis 8. The storage plate 1 is clamped in the center as well as also on the margin with the mask 3, 4 in contact on the seating face 7. This type of fixture of the storage plate 1 makes possible good heat transfer from the storage plate 1 onto the storage plate support 2, without a large arching d, which would damage the storage plate 1, being necessary. For the preferred optical storage plates 1 comprised of synthetic material, such as in particular for the especially suitable thin plates, such as DVDs 1, arching d of 0.1 mm to 2.0 mm is suitable, with the range from 0.5 mm to 1.5 mm being especially preferred. The storage plate support 2 according to the invention can be applied primarily for storage plate diameters DA, which are in the range from 20 to 150 mm and especially good results are obtained with plate diameters DA in the range from 50 to 130 mm. Also evident in FIG. 3 is the manner in which the masking of the center mask 4 and the masking of the outer mask 3 with respect to the storage plate acts through slight extension over of the plate margin, in that the annular margins are covered, with which for the coating a defined annular action face S to be coated is defined. For further improvement of the heat transfer, it is possible as stated to introduce additionally a gas between the storage plate 1 and the seating face 7 of the plate support 2, as is indicated schematically with the gas inlet channels 9. As contact gases are especially suitable heat-conducting gases such as helium.

A further improvement is attained by disposing a sealing element in the plate margin regions 6 outside and inside, between seating face 7 and storage plate back side. Thereby the outflow of the gas into the process vacuum volume can be prevented or inhibited and sensitive plasma processes are not disturbed.

While a specific embodiment of the invention has been shown and described in detail to illustrate the application of the principles of the invention, it will be understood that the invention may be embodied otherwise without departing from such principles.

What is claimed is:

1. In a storage plate support (2) having a central axis (8) and for receiving a disk-shaped storage plate (1) having a central plate opening (5), and which is to be subjected to surface treatment in a vacuum apparatus, with a plate seating which forms a seating face (7) for the plate (1), an outer mask (3) for clamping the plate (1) peripherally against the support (2) end a clampable center mask (4) disposed in the region of the plate opening (5), the improvement comprising: the seating face (7) being annularly arched about the center axis (8).

2. The storage plate support as claimed in claim 1, including means for at least one of heating and cooling the support.

3. The storage plate support as claimed in claim 1, wherein the seating face (7) has an arching (d) relative to a planar seating face, which is in the range from about 0.1 mm to about 2.0 mm.

4. The storage plate support as claimed in claim 3, wherein the seating face (7) has an arching (d) relative to a planar seating face, which is in the range from about 0.5 mm to about 1.5 mm.

5. The Storage plate support as claimed in claim 1, wherein the outer mask (3) has an outer diameter (DA) in the range from about 20 to about 150 mm.

6. The storage plate support as claimed in claim 5, wherein the outer mask (3) has an outer diameter (DA) in the range from about 50 to about 130 mm.

7. The storage plate support as claimed in claim 1, wherein at least in subregions on the seating face (7), a ductile and/or elastic contact material is provided for enlarging contact areas between the storage plate (1) and the plate support (2).

8. The storage plate support as claimed in claim 7, wherein the contact material is a foil and comprises a synthetic material and/or a metal.

9. The storage plate support as claimed in claim 1, wherein, in the plate support (2), at least one gas inlet channel (9) is provided for introducing a contact gas into an interspace formed of the seating face (7) and a back side of the storage plate (1).

10. The storage plate support as claimed in claim 9, wherein a region of the outer diameter ($D_A$) and/or in a region of the inner diameter ($D_i$) of the storage plate (1), annular sealing means for sealing the interspace are disposed on the seating face (7).

11. A method of using a storage plate support comprising treating an optical storage plate;

wherein said storage plate support (2) comprises a central axis (8) and receives a disk-shaped storage plate (1) having a central plate opening (5), and which is to be subjected to surface treatment in a vacuum apparatus, a plate seating forms a seating face (7) for the plate (1) that is annularly arched about the central axis (8), an outer mask (3) clamps the plate (1) peripherally against the support (2), and a clampable center mask (4) is disposed in the region of the plate opening (5).

12. The method according to claim 11, wherein the storage plate support is for optical storage plates selected from the group consisting of: CDs, CD-Rs, CD-RWs, DVDs, DVD-Rs and DVD-RWs.

13. The method according to claim 11, wherein the storage plate support is for optical storage plates comprised of synthetic material.

14. The method according to claim 13, wherein the storage plate support is for optical storage plates comprised of polycarbonate.

* * * * *